United States Patent
Song

(10) Patent No.: US 8,097,217 B2
(45) Date of Patent: Jan. 17, 2012

(54) ATMOSPHERIC PRESSURE PLASMA GENERATING APPARATUS BY INDUCTION ELECTRODE

(75) Inventor: Seok Kyun Song, Seoul (KR)

(73) Assignee: Uion Co., Ltd (KR)

( * ) Notice: Subject to any disclaimer, the term of this patent is extended or adjusted under 35 U.S.C. 154(b) by 1136 days.

(21) Appl. No.: 11/774,097

(22) Filed: Jul. 6, 2007

(65) Prior Publication Data
US 2009/0010818 A1    Jan. 8, 2009

(51) Int. Cl.
*B01J 19/08* (2006.01)
(52) U.S. Cl. .................................. 422/186.04
(58) Field of Classification Search ............. 422/186.04
See application file for complete search history.

(56) References Cited

U.S. PATENT DOCUMENTS

| | | |
|---|---|---|
| 5,387,842 A | 2/1995 | Roth et al. |
| 5,414,324 A | 5/1995 | Roth et al. |
| 6,424,091 B1 | 7/2002 | Sawada et al. |

FOREIGN PATENT DOCUMENTS

JP    09-141087 A  *  6/1997

OTHER PUBLICATIONS

T.Yokoyama, et al., The mechanism of the stabilisation of glow plasma at atmospheric pressure, J. Phys. D: Appl. Phys., 1990, p. 1125-1128, 23, IOP Publishing Ltd., U.K.

* cited by examiner

*Primary Examiner* — Kishor Mayekar
(74) *Attorney, Agent, or Firm* — John K. Park; Park Law Firm

(57) ABSTRACT

The present invention relates to an atmospheric pressure plasma generating apparatus using an induction electrode. In particular, one or more upper metal electrodes are disposed on the upper side and an induction electrode and an induction electrode antenna are disposed opposite to the upper electrodes, so that a high-density plasma is generated at low applied voltage. Further, base electrodes are used to preclude interference between the upper electrodes. Thus, lots of the upper electrodes can be constructed at a narrow space, the uniformity of intensity of a generated plasma can be secured, the source of a plasma can be provided by the upper electrodes, and the intensity of a plasma can be increased. In addition, a lower electrode is disposed on the lower side in order to extend the length of a generated plasma.

1 Claim, 4 Drawing Sheets

ATMOSPHERIC PRESSURE PLASMA GENERATING APPARATUS BY INDUCTION ELECTRODE

BACKGROUND OF THE INVENTION

1. Field of the Invention

The present invention relates, in general, to an atmospheric pressure plasma generating apparatus using an induction electrode (IE), and more particularly, to an atmospheric pressure plasma generating apparatus using an induction electrode, having a structure in which one or more upper metal electrodes are disposed on the upper side and the induction electrode is disposed opposite to the upper metal electrodes in order to induce generation of a plasma, excessively accumulate charges on an induction electrode antenna, easily induce a plasma discharge at low voltage by utilizing a next discharge, and enable generation of a high density plasma, wherein a plasma is generated by an upper electrode and the length of the generated plasma is induced to increase downwardly by means of a lower electrode, so that an metal induction electrode and a dielectric material can be properly used and the length of the generated plasma can be increased through the lower electrode, enabling an efficient processing of a large area sample.

2. Background of the Related Art

In general, a plasma has a fourth material state, and consists of ion and electrons, which are generated by an externally applied electric field, etc., radicals, neutral particles and so on. The plasma has a material state of electrical neutrality from a comprehensive point of view. Ion, electrons, radicals, etc. within the plasma have been widely used for such fields as surface reforming, etching, coating, sterilization, disinfection, ozone generation, dyeing, purification of waste water and tap water, air purification and high luminance lamps.

The plasma can be classified into a low-pressure plasma (several mmTorr to several Torr) and an atmospheric pressure plasma (several Torr to 760 Torr) depending on generated pressure.

Of them, the low-pressure plasma can be easily generated, but requires expensive apparatuses for maintaining a low-pressure state, such as a vacuum chamber and an exhaust device. Further, the low-pressure plasma has a limit to mass-production processing due to the product input method of a batch type. In contrast, the atmospheric pressure plasma can be generated in the state of an atmospheric pressure (760 Torr), and thus does not require an expensive vacuum system. Further, the atmospheric pressure plasma is advantageous in that it enables a consecutive process and mass production.

The most widely used method as a method of generating a plasma while prohibiting arc discharge at an atmospheric pressure is a dielectric material barrier type (T. Yokoyama, M. Kogoma, T. Moriwaki, and S. Okazaki, J. Phys. D: Appl. Phys. V23, p 1125 (1990)), (John R. Roth, Peter P. Tsai, Chaoyu Lin, Mouuir Laroussi, Paul D. Spence, "Steady-state, Glow discharge plasma", U.S. Pat. No. 5,387,842 (Feb. 7, 1995), "One Atmosphere, Uniform Glow discharge plasma", U.S. Pat. No. 5,414,324 (May 9, 1995)).

Furthermore, an AC barrier type is a method in which a ceramic dielectric material for prohibiting arc discharge, such as alumina, is coated on both sides or one side of upper and lower electrodes disposed with an adequate gap therebetween, and high AC pulse voltage is applied to generate an atmospheric plasma.

The dielectric material barrier type of the upper and lower electrodes is not appropriate for a processing, such as a sample of a 3D structure, because the length of generated plasma is not large due to a limited distance between the electrodes. Plasma torch, plasma shower and so on are suitable for processing a sample of a 3D structure, etc., but are mostly used for arc plasma. Thus, plasma torch, plasma shower and so on are difficult in large area processing due to a small plasma generation area, and find limited fields due to thermal plasma. The plasma shower type (Y. Sawada, K. Nakamura, H. Kitamura, Y. Inoue, "Plasma treatment apparatus and plasma treatment method performed by use of the same apparatus", U.S. Pat. No. 6,424,091 (Jul. 23, 2002)) using the dielectric material barrier employs corner or glow discharge not high temperature plasma of arc, and is a low temperature plasma shower type enabling a large area.

However, the plasma shower type using the dielectric material barrier is problematic in processing a sample of a 3D structure since the length of plasma generated is several mm.

SUMMARY OF THE INVENTION

Accordingly, the present invention has been made in an effort to solve the above problems occurring in the prior art, and it is an object of the present invention to provide an atmospheric pressure plasma generating apparatus using an induction electrode, in which a uniform plasma can be generated at a large area by using an upper electrode, an induction electrode, an induction electrode antenna and base electrodes, and the length of plasma generated can be increased and a large-area 3D sample can be processed efficiently by applying a lower electrode.

To accomplish the above objects, according to the present invention, there is provided an atmospheric pressure plasma generating apparatus using an induction electrode including: one or more upper electrodes; the induction electrode disposed opposite to the upper electrodes; an induction electrode antenna connected to the induction electrode; base electrodes disposed spaced apart from the induction electrode antenna at a predetermined interval, the base electrodes being grounded; a dielectric material surrounding the induction electrode antenna and the base electrodes; a rotary unit for rotating the upper electrodes, the induction electrode, the induction electrode antenna, the dielectric material and the base electrodes; and a chamber surrounding the rotary unit and having a working gas inlet.

According to the aspect of the present invention, there is provided an atmospheric pressure plasma generating apparatus using an induction electrode including: wherein high AC voltage is applied between the upper electrodes and the base electrodes in order to generate a plasma.

According to the aspect of the present invention, there is provided an atmospheric pressure plasma generating apparatus using an induction electrode including: one or more upper electrodes; one or more antenna electrodes disposed opposite to the upper electrodes; an antenna connected to the antenna electrodes; a rotary unit for rotating the upper electrodes, the antenna electrodes and the antenna; and a chamber configured to surround the rotary unit and including a working gas inlet.

According to the aspect of the present invention, there is provided an atmospheric pressure plasma generating apparatus using an induction electrode including: wherein high AC voltage is applied to the upper electrodes in order to generate a plasma.

According to the aspect of the present invention, there is provided an atmospheric pressure plasma generating apparatus using an induction electrode including: one or more upper wire electrodes; basic shield electrodes disposed at both sides of the upper wire electrodes and being grounded; a dielectric material surrounding the basic shield electrodes; working gas distributors disposed over the upper wire electrodes, the basic shield electrodes and the dielectric material; and a chamber configured to accommodate the respective constituent elements and including a working gas tube for supplying a working gas.

According to the aspect of the present invention, there is provided an atmospheric pressure plasma generating apparatus using an induction electrode including: wherein high AC voltage is applied between the upper wire electrodes and the basic shield electrodes in order to generate a plasma.

According to the aspect of the present invention, there is provided an atmospheric pressure plasma generating apparatus using an induction electrode including: wherein each of both edges of each of the upper wire electrodes has a curved radius of 5 to 50 mm.

According to the aspect of the present invention, there is provided an atmospheric pressure plasma generating apparatus using an induction electrode including: wherein a bottom portion of each of both edges of each of the upper wire electrodes is 0 to 20 mm higher than a central portion of each of the wire electrodes.

According to the aspect of the present invention, there is provided an atmospheric pressure plasma generating apparatus using an induction electrode including: wherein a sample is disposed under the chamber.

According to the aspect of the present invention, there is provided an atmospheric pressure plasma generating apparatus using an induction electrode including: wherein a lower electrode is disposed under the sample.

According to the aspect of the present invention, there is provided an atmospheric pressure plasma generating apparatus using an induction electrode including: wherein the lower electrode is surrounded by the dielectric material.

According to the aspect of the present invention, there is provided an atmospheric pressure plasma generating apparatus using an induction electrode including: wherein high AC voltage having a phase difference of 180 degrees from those applied to the upper electrodes is applied to the lower electrode so as to generate a plasma.

The objects of the present invention are not limited to the above-mentioned object and other objects that have not mentioned above will become evident to those skilled in the art from the following description.

BRIEF DESCRIPTION OF THE DRAWINGS

Further objects and advantages of the invention can be more fully understood from the following detailed description taken in conjunction with the accompanying drawings in which.

DETAILED DESCRIPTION OF THE PREFERRED EMBODIMENT

The present invention will now be described in detail in connection with specific embodiments with reference to the accompanying drawings.

Figure 1:
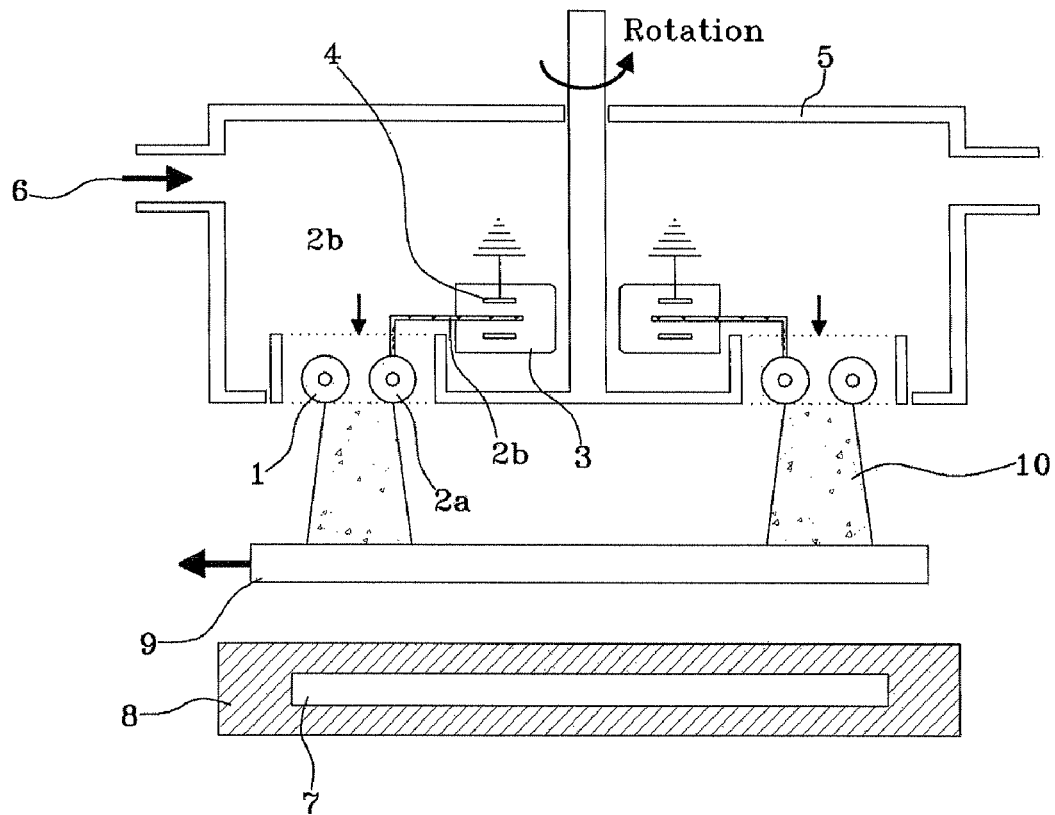
FIG. 1 is a cross-sectional view of an atmospheric pressure plasma generating apparatus using a 3D MIE induction electrode according to an embodiment of the present invention.
Figure 2:
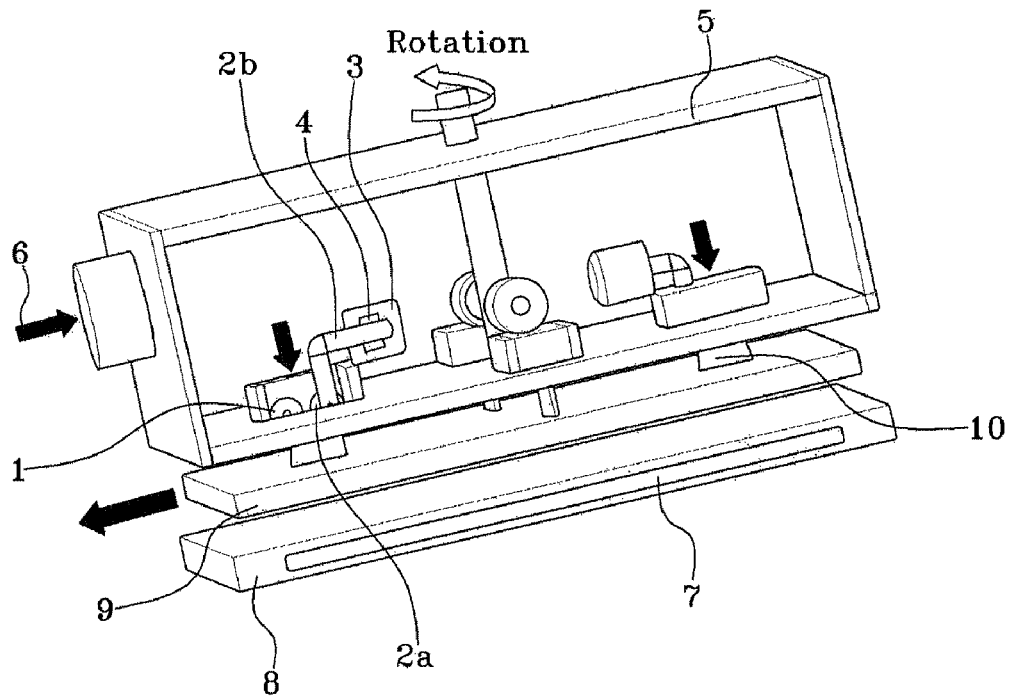
FIG. 2 is a geometric view of the atmospheric pressure plasma generating apparatus using the 3D MIE induction electrode according to an embodiment of the present invention.

FIG. 1 is a cross-sectional view of an atmospheric pressure plasma generating apparatus using a 3D MIE induction electrode according to an embodiment of the present invention. FIG. 2 is a geometric view of the atmospheric pressure plasma generating apparatus using the 3D MIE induction electrode according to an embodiment of the present invention.

The atmospheric pressure plasma generating apparatus using the 3D MIE induction electrode of the present invention is described below with reference to FIGS. 1 to 2. There are shown in FIGS. 1 and 2 an upper electrode 1, and an induction electrode 2a opposite to the upper electrode 1. The induction electrode 2a is connected to an induction electrode antenna 2b.

Base electrodes 4 are spaced apart from the induction electrode antenna 2b at a predetermined interval. The induction electrode antenna 2b and the base electrodes 4 are surrounded by a dielectric material 3, and the base electrodes 4 are grounded.

A chamber 5 is configured to surround a rotary unit for rotating the upper electrode 1, the induction electrode 2a, the induction electrode antenna 2b, the dielectric material 3 and the base electrodes 4. The chamber 5 includes a working gas inlet 6.

A sample 9 is disposed under the chamber 5 including the upper plasma generation components.

A lower electrode 7 is disposed under the sample 9, and is surrounded by a dielectric material 8.

A phenomenon in which plasma is generated is described with reference to FIGS. 1 and 2. If high AC voltage is applied to the upper electrode 1 and the base electrodes 4, the potential difference is generated between the upper electrode 1 and the induction electrode 2a, generating a plasma. For example, if plus potential is applied to the upper electrode 1, charges flow through the induction electrode 2a to the induction electrode antenna 2b by means of the generated plasma. Plus charges are accumulated on the induction electrode antenna 2b by means of a zero potential of the base electrodes 4 shielded by the dielectric material 3. If the potential difference between the upper electrode 1 and the induction electrode 2a is reduced, the plasma is not transferred as arc, but discharge is stopped and the induction electrode 2a has a plus state by means of the induction electrode antenna 2b charged by the plus.

In reality, if the intensity of the plasma is strong, that is, the current is high, the induction electrode antenna 2b is excessively charged and thus becomes a potential state (VU<VI, where the upper electrode potential difference is VU and the induction electrode potential difference is VI), which is higher than applied potential.

If the AC potential changes and the upper electrode 1 is thus applied with a minus potential, a discharge is generated due to a potential difference (=VU+VI) of the sum of the upper electrode 1 and the induction electrode 2a having the plus potential, and the induction electrode antenna 2b is accumulated with minus charges. If the potential difference between the upper electrode 1 and the induction electrode 2a reduces again, the discharge is stopped, and the induction electrode 2a has a minus state by means of the induction electrode antenna 2b charged with the minus. This situation is repeatedly generated in proportion to an applied frequency. This discharge mechanism will be referred to as a "3 Dimension Metal Induction Electrode (MIE) Type" in the present invention.

Plasma discharge time is lengthened and the density of plasma is increased by means of the mechanism in which the induction electrode antenna 2b is charged with electric charges. Further, there is an advantage in that discharge can be secured even a low applied voltage.

The generated plasma 10 is spout downwardly by means of the working gas inlet 6. The intensity of the plasma is in reverse proportion to the distance between the induction electrode antenna 2b and the base electrodes 4, and is proportional to the size of the distance. In this case, if high AC voltage having a phase difference of 180 degrees from those applied to the upper electrode 1 is applied between the lower electrode 7 and the base electrodes 4, electrons and ions of plasma, which is generated between the upper electrode 1 and the induction electrode 2a, becomes a higher potential state (an upper electrode region: VU+VD, an induction electrode region: VU+VI+VD, where VD is a lower electrode potential). Thus, the plasma is lengthily induced toward the lower electrode 7. The length of the generated plasma can be 10 cm or more. Further, if the base electrodes 4 are grounded, a double high voltage potential can be employed by a certain insulating technology. The base electrodes 4 are grounded for safety and stability.

The advantages obtained by using the upper electrode 1, the induction electrode 2a, the induction electrode antenna 2b, the dielectric material 3 and the base electrodes 4 are as follows.

First, as mentioned earlier, strong plasma can be obtained at a narrow space.

Second, plasma can be generated in several plasma-generating cells at the same time by using one power supply device.

Third, the upper electrode 1 and the induction electrode 2a are made of metal material, and are thus not broken at strong plasma. Thus, the length of plasma generated can be increased since strong plasma can be generated.

Fourth, in describing the principle of generating a plasma, charges accumulated on the induction electrode antenna 2b contribute to generation of plasma again when the polarity of applied voltage is reversed. Therefore, there is no energy loss due to the dielectric material, which is generated in the existing dielectric material barrier method, and an additional cooling unit is not required since there is no generation of heat.

Figure 3:
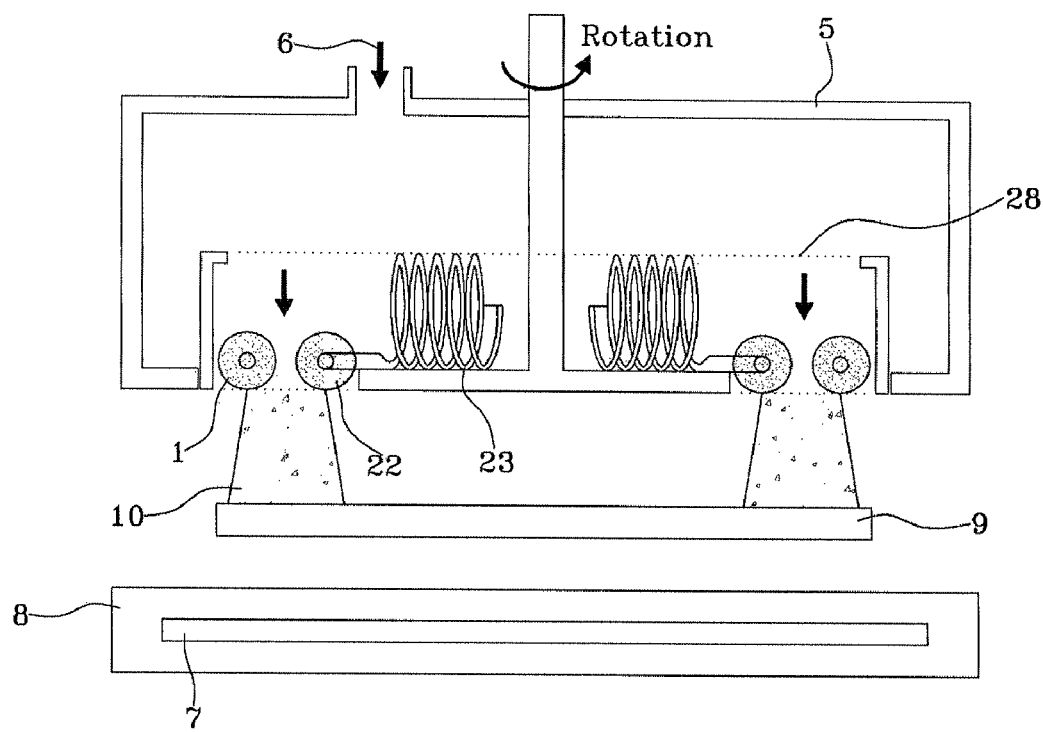
FIG. 3 is a cross-sectional view of an atmospheric pressure plasma generating apparatus using a 3D AIE induction electrode according to another embodiment of the present invention.
Figure 4:
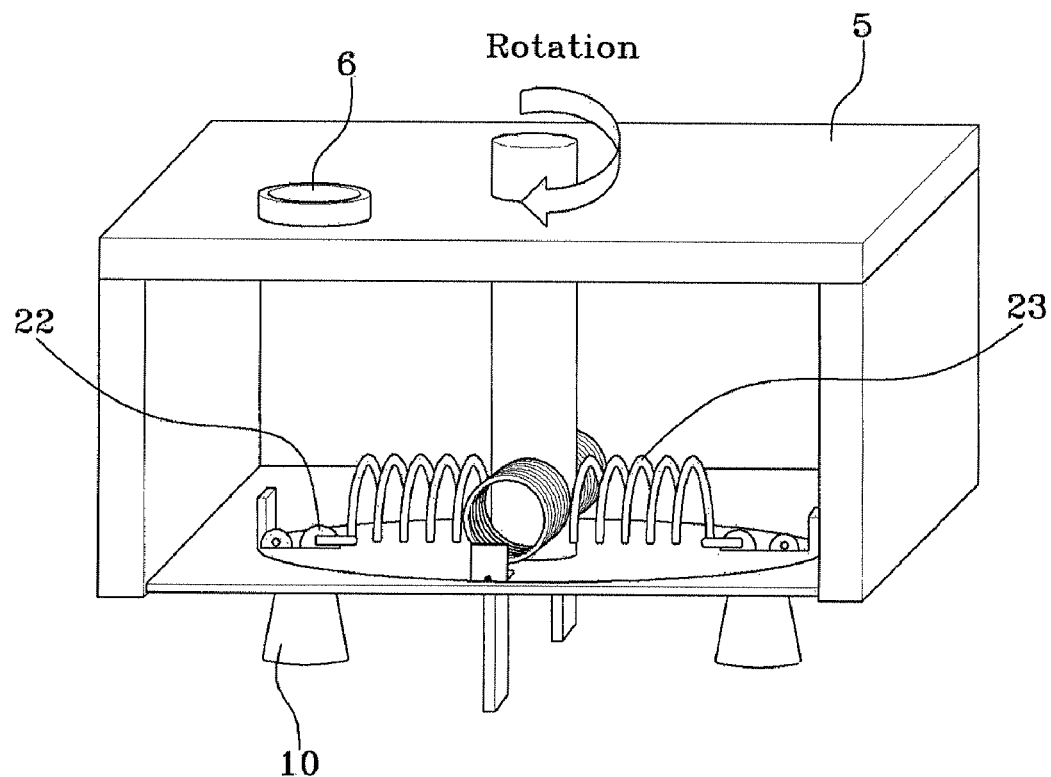
FIG. 4 is a geometric view of the atmospheric pressure plasma generating apparatus using the 3D AIE induction electrode according to another embodiment of the present invention.

FIG. 3 is a cross-sectional view of an atmospheric pressure plasma generating apparatus using a 3D AIE induction electrode according to another embodiment of the present invention. FIG. 4 is a geometric view of the atmospheric pressure plasma generating apparatus using the 3D AIE induction electrode according to another embodiment of the present invention. The atmospheric pressure plasma generating apparatus includes, as illustrated in FIGS. 3 and 4, an upper electrode 1, an antenna electrode 22, and an antenna 23 connected to the antenna electrode 22.

The upper electrode 1, the antenna electrode 22 and the antenna 23 are accommodated within a plasma-generating unit 28. The plasma-generating unit 28 is surrounded by a chamber 5. An inlet 6 through which a working gas can enter is formed at the top of the chamber 5. The plasma-generating unit 28 is rotated. A sample 9 is disposed under the upper electrode 1 and the antenna electrode 22. A lower electrode 7 is disposed under the sample 9, and is surrounded by a dielectric material 8.

A phenomenon in which plasma is generated is described with reference to FIGS. 3 and 4. If high AC voltage is applied to the upper electrode 1, plasma is generated between the upper electrode 1 and the antenna electrode 22. The intensity of the generated plasma becomes strong as the size of the antenna 23 increases.

In the principle in which plasma is generated between the antenna electrode 22 and the upper electrode 1, high AC voltage is applied to ignite plasma by means of a potential difference between the upper electrode 1 having a high potential and the antenna electrode 22 having a zero potential. The generated plasma causes a high potential to be formed in the antenna 23 through the antenna electrode 22 having an electrical path formed therein. In other words, as electrons of the antenna 23 are emitted or absorbed nearby, the antenna 23 has a high potential.

In the concrete, if a high plus (+) voltage of AC voltage is applied to the upper electrode 1, plasma is generated to form an electrical path. Electrons on the antenna electrode 2 and the antenna 23 are emitted outwardly and become a high plus (+) potential. Thereafter, if the polarity of the AC voltage changes and a high minus (−) voltage is therefore applied to the upper electrode 1, plasma is generated due to a potential difference between the high potential of the antenna 23, which has been formed in the previous cycle, and the high plus (+) potential of the antenna electrode 22. The potentials of the antenna 23 and the antenna electrode 22 changes to a minus (−) potential through the plasma electrical path. This process is repeatedly performed. This discharge mechanism will be referred to as a "3 Dimension Antenna Induction Electrode (AIE) Type in the present invention.

If the size of the antenna is large, the amount of electrons that are emitted or absorbed is increased and the density of the generated plasma is increased. It is therefore possible to generate a variety of plasmas, such as corner discharge, normal glow discharge and abnormal glow discharge, depending on the size of the antenna. If a very high AC voltage is applied to the upper electrode 1, a very high potential is also formed in the antenna 23, and corner plasma in which gas around the antenna 23 is disintegrated into electrons and ions is formed. The formed electrons and ions form strong plasma due to a higher potential difference while being attached to or detached from the antenna 23.

In the above process, the potential formed in the antenna 23 due to excessive charging is higher than applied voltage, and is thus effective in generation of plasma.

As mentioned above, the advantage of the present invention, which is obtained by using the antenna 23 and the antenna electrode 22, is that plasma can be generated in a plasma cell using several metal electrodes as one power supply device while not generating arc between metal electrodes.

In general, if a high voltage is applied to several metal electrodes spaced apart from each other at predetermined intervals, arc is generated between electrodes having the closest distance and a strong electrical path is thus formed due to strong plasma. Therefore, a very high current flows, applied voltage is attenuated, and plasma cannot be generated in several metal electrodes at the same time. The present invention can solve the problem, and is advantageous in that it can generate plasma between several metal electrodes and can easily control specific heat corner or glow discharge plasma by controlling the size of the antenna.

As described above, the generated plasma results in downward plasma 10 due to a potential difference between then input working gas 6 and a lower electrode 7. For reference, when the lower electrode 7 does not exist, the length of the generated plasma can range from 2 to 5 cm depending on the size of the antenna. If a high voltage is applied to the lower electrode 7, the length of the generated plasma can increase to 5 to 10 cm depending on the voltage, and the density of the plasma on the surface of the sample 9 also increases.

Figure 5:
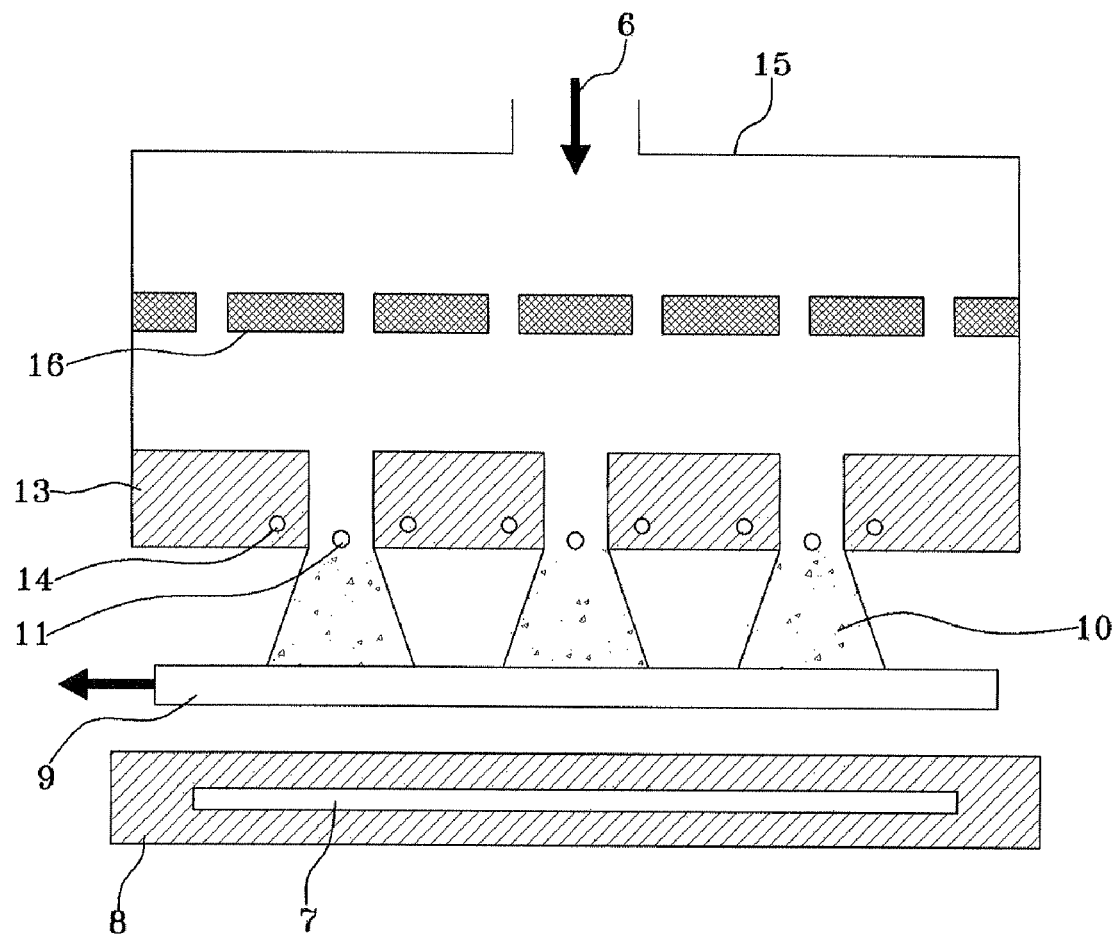
FIG. 5 is a cross-sectional view of an atmospheric pressure plasma generating apparatus using a 3D DIWE induction electrode according to still another embodiment of the present invention.
Figure 6:
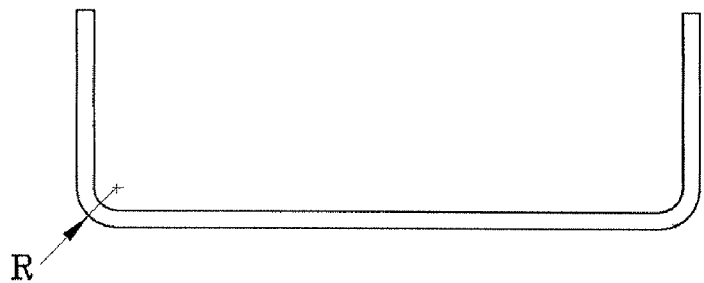
FIGS. 6 and 7 illustrate the shapes of upper wire electrodes of the atmospheric pressure plasma generating apparatus using the 3D DIWE induction electrode according to still another embodiment of the present invention.
Figure 7:
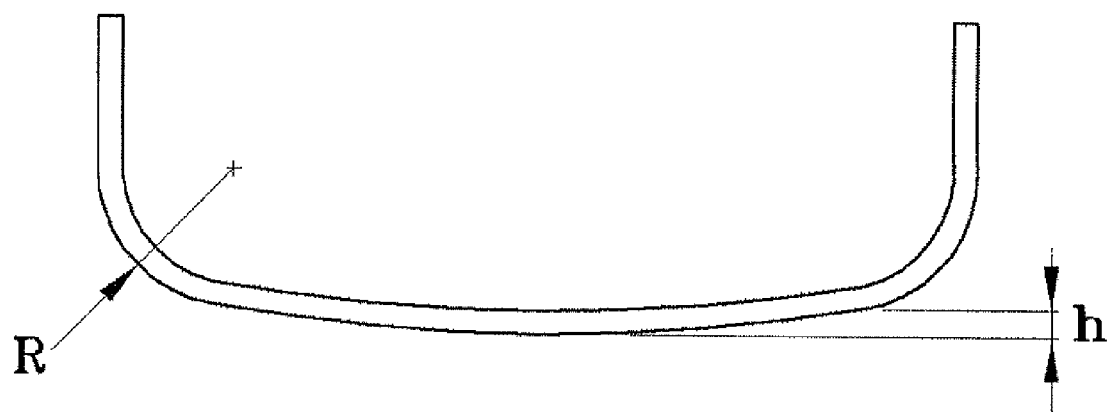

FIG. 5 is a cross-sectional view of an atmospheric pressure plasma generating apparatus using a 3D DIWE induction electrode according to still another embodiment of the present invention. FIGS. 6 and 7 illustrate the shapes of upper wire electrodes of the atmospheric pressure plasma generating apparatus using the 3D DIWE induction electrode according to still another embodiment of the present invention.

The atmospheric pressure plasma generating apparatus includes, as illustrated in FIG. 5, upper wire electrodes 11, basic shield electrodes 14 disposed at both sides of each of the upper wire electrodes 11, and a dielectric material 13 surrounding the basic shield electrodes 14. The upper wire electrodes 11, the basic shield electrodes 14 and the dielectric material 13 constitute an upper plasma generating constituent element, and is hereinafter referred to as an "upper plasma-generating constituting element unit".

Working gas distributors 16 for uniformly supplying a working gas to the upper plasma-generating constituting element are disposed on the upper side of the upper plasma-generating constituting element. The upper plasma-generating constituting element unit includes a chamber 15 having a working gas supply unit for accommodating the respective constituent element unit and supplying the working gas 6.

A sample 9 is disposed under the upper plasma-generating constituting element unit. A lower electrode 7 is disposed under the sample 9. The lower electrode 7 is surrounded by a dielectric material 8.

A phenomenon in which plasma is generated is described below with reference to FIG. 5. If high AC voltage is applied to the upper wire electrodes 11 and the basic shield electrodes 14, plasma is generated between the upper wire electrodes 11 and the basic shield electrodes 14. The generated plasma is not transferred as arc by means of the dielectric material 13, but is formed at a wide area along the upper wire electrodes 11. The intensity of the plasma becomes strong as the thickness of the dielectric material 13 decreases.

In this case, if the high AC voltage having a phase difference of 180 degrees from those applied to the upper wire electrodes 11 is applied to the lower electrode 7 and the basic shield electrodes 14, electrons and ions of the generated plasma become a higher potential state (an upper wire electrode potential+a lower electrode potential) between the upper wire electrodes 11 and the dielectric material 13. Thus, the plasma is lengthily generated toward the lower electrode 7. The length of the generated plasma can be 6 cm or more.

In the case where the basic shield electrodes 14 are grounded, there is an advantage in that a double high voltage potential can be obtained by a constant insulating technology. For safety and stability, the basic shield electrodes 14 are grounded. The discharge mechanism will be referred to as a 3 Dimension Dielectric Induction Wire Electrode (DIWE) Type in the present invention.

The basic shield electrodes 14 have the following four roles.

First, long plasma can be generated due to the principle of generating original plasma.

If the basic shield electrodes 14 do not exist, plasma must be ignited with only a potential difference between the upper wire electrodes 11 and the lower electrode 7 and discharge must be maintained. Thus, higher voltage is required in order to ignite the plasma and insulating problems, etc. occur. Further, an arc channel is formed due to the high voltage and partial breakage occurs at the time of discharge, and the plasma is not uniformly generated.

Second, generation of uniform plasma can be induced. The potential of the basic shield electrodes 14 is always kept to zero, and the potential on the surface of the dielectric material 13 around the upper wire electrodes 11 is lowered. Accordingly, plasma can be generated constantly.

If the basic shield electrodes 14 do not exist, electric charges are absorbed to the dielectric material around the upper wire electrodes 11, and a potential difference on the surface of the upper wire electrodes 11 and the dielectric material 13 is decreased, weakening generation of plasma. In particular, plasma is rarely generated in the internal cells.

In the same manner, in the case where only the upper wire electrodes 11 exist without the dielectric material 13 and the basic shield electrodes 14, charged particles are diffused into the neighboring upper wire electrodes due to the influence of the plasma generated in the neighboring wire electrodes. Accordingly, the potential difference decreases, making it difficult to generate plasma.

Actual experiments revealed the strongest plasma was generated at the upper wire electrodes of the most outmost cells, and very weak plasma was formed at the upper wire electrodes of the internal cells. As a result of the experiments, it was found that a distance between neighboring upper wire electrode cells is 150 mm or more in order to avoid interference thereof, though not perfect.

In contrast, in the present invention, the basic shield electrodes 14 and the dielectric material 13 are formed near the upper wire electrodes 11. Thus, constant plasma intensity can be obtained every upper wire electrode cell even when the upper wire electrodes cell gap is 50 mm or fewer. In other words, there is an advantage in that the plasma distribution density can be increased uniformly even at a narrow space.

Third, the density of plasma can be increased. As a potential applied to the upper wire electrodes 11 and the basic shield electrodes 14 is increased by increasing the density of original plasma, the density of plasma irradiated on the sample 9 can be increased.

Fourth, the intensity of plasma can be controlled easily.

The intensity of original plasma can be controlled through control of voltage applied to the upper wire electrodes 11 and the basic shield electrodes 14. Thus, corner and glow plasma states can be controlled easily because the density of plasma irradiated on the sample 9 is controlled.

As mentioned above, an advantage of the present invention, which is obtained by using the upper wire electrodes 11, the basic shield electrodes 14 and the lower electrode 7, is that 3D plasma of 6 cm or more can be generated uniformly at a narrow space without a mechanical apparatus, enabling a large area processing.

In the prior art, for the purpose of a large-area 3D processing, a complicate method of arranging several plasma torches of a point or a small area longitudinally was used.

The conventional method is problematic in that it is complicated in structure, has a poor uniformity and a weak intensity of plasma, and has a long processing time and so on. However, the 3D DIWE type of the present invention can solve the conventional problems, and it is advantageous in that it can generate plasma uniformly at several long metal wire electrodes, enabling a large-area 3D processing, and can easily control specific heat corner or glow discharge plasma.

FIGS. 6 and 7 illustrate the shapes of the 3D DIWE upper wire electrodes according to still another embodiment of the present invention. The 3D DIWE upper wire electrodes are formed to have edges of a radius R, as illustrated in the drawings. If the radius R is small or at a right angle, very strong plasma can be formed at both edges with low interference, which makes it impossible to secure the uniformity of plasma.

In contrast, if the radius R is too large, space utilization efficiency is low. Experiments revealed that the radius R of about 10 to 30 mm was appropriate, and the uniformity of plasma could be secured when the radius R ranges from 5 to 50 mm depending on a distance and a plasma state.

In FIG. 6 in which the 3D DIWE upper wire electrodes are shown to have the radius R and are flat, uniformity can be secured up to a plasma length of 15 mm at the time of streamer glow discharge, and very strong plasma is generated at both edges when the plasma length is 15 mm or larger. However, in FIG. 7 in which the 3D DIWE upper wire electrodes are shown to have the radius R and have portions at both sides, which are higher h than the center, uniformity can be secured even when a plasma length is 15 mm or more at the time of glow discharge, and streamer glow plasma is distributed at regular intervals.

At the length of plasma generated is long, the height h is increased. The length can range from 0 to 20 mm. In the case of corner discharge, when the height h ranges from 0 to 10 mm, which is lower than that at the time of glow discharge, uniform plasma can be easily implemented.

In the present invention, the working gas can include all kinds of gases.

As described above, the atmospheric pressure plasma generation apparatus according to the present invention includes an upper electrode, an induction electrode, an induction electrode antenna, a dielectric material and base electrodes, and can generate high-density plasma by using a simple structure, enabling a large-area 3D processing. Through generated plasma, specific heat corner or glow discharge plasma can be controlled easily, and a sample of a large-area 3D structure can be processed efficiently.

Further, a structure in which high-density plasma can be generated outwardly can be implemented without being limited to a limited space. It is therefore possible to uniformly process samples with no regard to the size of the samples.

Furthermore, through generated plasma, specific heat corner or glow discharge plasma can be easily controlled through control of applied voltage.

Furthermore, a lower electrode is disposed under a sample so that generated plasma can reach the surface of the sample. Accordingly, there is an advantage in that samples can be processed uniformly in a three-dimensional manner regardless of the size of the samples.

Furthermore, since the upper metal electrode, the induction electrode, the induction electrode antenna, the dielectric material and the base electrodes are used, a plasma generating apparatus, which has high energy efficiency, a simple structure and can fabricate a large area at low cost, can be fabricated.

In addition, complicated 3D samples can be cleaned and surface reformed easily and stably.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. An atmospheric pressure plasma generating apparatus using an antenna electrode, the apparatus comprising:
   one or more upper electrodes;
   one or more antenna electrodes disposed opposite to the upper electrodes;
   an antenna connected to the antenna electrodes;
   a rotary unit for rotating the upper electrodes, the antenna electrodes and the antenna;
   a chamber configured to surround the rotary unit and including a working gas inlet; and
   a lower electrode diposed under a sample disposed under the chamber and surrounded by a dielectric material,
   wherein a first high AC voltage is applied to the upper electrodes and a second high AC voltage having a phase difference of 180 degrees from the first high AC voltage is applied to the lower electrode so as to generate a plasma.

* * * * *